(12) United States Patent
Cheng

(10) Patent No.: US 8,327,314 B2
(45) Date of Patent: Dec. 4, 2012

(54) METHOD FOR SETTING TEST POINT

(75) Inventor: Li-Jung Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 35 days.

(21) Appl. No.: 13/014,300

(22) Filed: Jan. 26, 2011

(65) Prior Publication Data
US 2012/0124544 A1 May 17, 2012

(30) Foreign Application Priority Data

Nov. 17, 2010 (TW) .............................. 99139603 A

(51) Int. Cl.
*G06F 17/50* (2006.01)
(52) U.S. Cl. ......... 716/137; 716/119; 716/126; 716/135
(58) Field of Classification Search .................. 716/119, 716/126, 135, 137
See application file for complete search history.

(56) References Cited

U.S. PATENT DOCUMENTS 7,207,019 B2 * 4/2007 Shiota ........................... 716/112

* cited by examiner

*Primary Examiner* — Vuthe Siek
*Assistant Examiner* — Brian Ngo
(74) *Attorney, Agent, or Firm* — Morris Manning & Martin LLP; Tim Tingkang Xia, Esq.

(57) ABSTRACT

A method for setting a test point is applied to dispose at least one test point on a circuit board in a trace file, which includes steps of reading the trace file, in which the trace file includes at least one trace; determining whether the trace has an initial test point; and setting a test point on the trace that does not have the initial test point. According to the method for setting a test point, cost and time for manually disposing the test point are saved, and an error rate when the test point is arranged is further reduced, thereby effectively improving production efficiency of the circuit board.

11 Claims, 3 Drawing Sheets

METHOD FOR SETTING TEST POINT

CROSS-REFERENCE TO RELATED APPLICATIONS

This non-provisional application claims priority under 35 U.S.C. §119(a) on Patent Application No(s). 099139603 filed in Taiwan, R.O.C. on Nov. 17, 2010, the entire contents of which are hereby incorporated by reference.

BACKGROUND OF THE INVENTION

1. Field of Invention

The present invention relates to a method for setting a test point, and more particularly to a method for setting a test point capable of disposing the test point through an automatic jig.

2. Related Art

A printed circuit board (PCB) is a key constitutive element in an electronic device, and has a main function of providing a stable circuit environment by circuits among fixed parts and communicated parts. Generally, the PCBs may be mainly classified into single-sided boards, double-sided boards, and multi-layer boards, according to a mode of circuit configuration. The single-sided board comprises an insulating substrate, which is a supporting body for installing parts, and a metal wiring for connecting the parts is laid out on the insulating substrate.

As the functions of an electronic device become more diversified, the number of the parts is increasingly increased, a wiring design of the circuit board becomes more complex, and the single-sided board gradually gets insufficient in use. Therefore, the double-sided board comes in handy, in which the circuits are laid out on two opposite surfaces of the insulating substrate, and circuit vias are laid out on the insulating substrate, so as to connect circuit lines on the two opposite surfaces. In addition, the multi-layer board is applied to a complex circuit environment, in which the circuits are laid out as a multi-layer structure and compressed together, and the circuits among the layers are electrically communicated with each other through the circuit vias laid out among the layers.

A conventional method for forming a PCB includes the following steps. Firstly, a circuit designer designs a wiring diagram of parts. Then, a layout person performs a layout action for the wiring diagram of parts by using a PCB layout software tool. Consequently, the layout person disposes a corresponding test point on each node in a layout diagram according to the layout image displayed on a computer monitor by using the PCB layout software tool. The node is defined as a wiring joint for connecting any two parts, and each node should be in coordination with a test point. Finally, after disposing the test point and checking a distribution status, the layout person may convert a final result of the layout image into literal data of the layout and output the literal data, to allow drawing software to draw the literal data of the layout as a layout image of the PCB. A subsequent PCB manufacturer may load materials accordingly and fabricate PCBs as finished products.

However, it should be noted that, in the conventional method for disposing the test point on the circuit board, test points are manually disposed one by one by the layout person. Thus, labor cost is increased, and further, the layout person is liable to make mistakes due to distraction, which virtually increases the production risk of PCBs and decreases the economic benefits.

Therefore, persons skilled in the art are in urgent need of addressing the conventional problem that the test point can only be manually disposed and providing a time-saving method for setting the test point with economic benefits.

SUMMARY OF THE INVENTION

Accordingly, the present invention is a method for setting a test point, to address the conventional problem.

The present invention provides a method for setting a test point, which is applied to dispose at least one test point on a circuit board in a trace file, and comprises: reading the trace file, in which the trace file comprises at least one trace; determining whether the trace has an initial test point; and, setting a test point on the trace that does not have the initial test point.

The method for setting the test point of the present invention further comprises: reading a next trace in the trace file when the trace has the initial test point.

The method for setting the test point of the present invention further comprises: output a trace that does not have the initial test point and the test point, to allow a user to manually set a test point position of the trace that does not have the initial test point and the test point.

The method for setting the test point of the present invention further comprises: reading a size of a via; determining whether the size of the via is smaller than a predetermined size; and, setting the test point on the via with a size smaller than the predetermined size.

The method for setting the test point of the present invention further comprises: reading a size of a next via when the size of the via is larger than the predetermined size.

The method for setting the test point of the present invention further comprises: outputting the via that does not have the initial test point and the test point, and to allow the user to manually set a test point position of the via that does not have the initial test point and the test point.

According to the method for setting the test point of the present invention, a test place is reserved around the test point.

According to the method for setting the test point of the present invention, the trace file includes position coordinates of the initial test point on the circuit board, a name of an element connected to the initial test point, and a test point type of the initial test point.

Therefore, in the method for setting the test point of the present invention, it is automatically determined whether a test point is set on the trace and/or the via according to the trace in the trace file and the size of the via. As a result, cost and time for manually disposing the test point are saved, and an error rate when the test point is arranged is further reduced, thereby effectively improving production efficiency of a PCB.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The detailed features and advantages of the present invention are described below in great detail through the following embodiments, the content of the detailed description is sufficient for those skilled in the art to understand the technical content of the present invention and to implement the present invention there accordingly. Based upon the content of the specification, the claims, and the drawings, those skilled in the art can easily understand the relevant objectives and advantages of the present invention.

Figure 1:
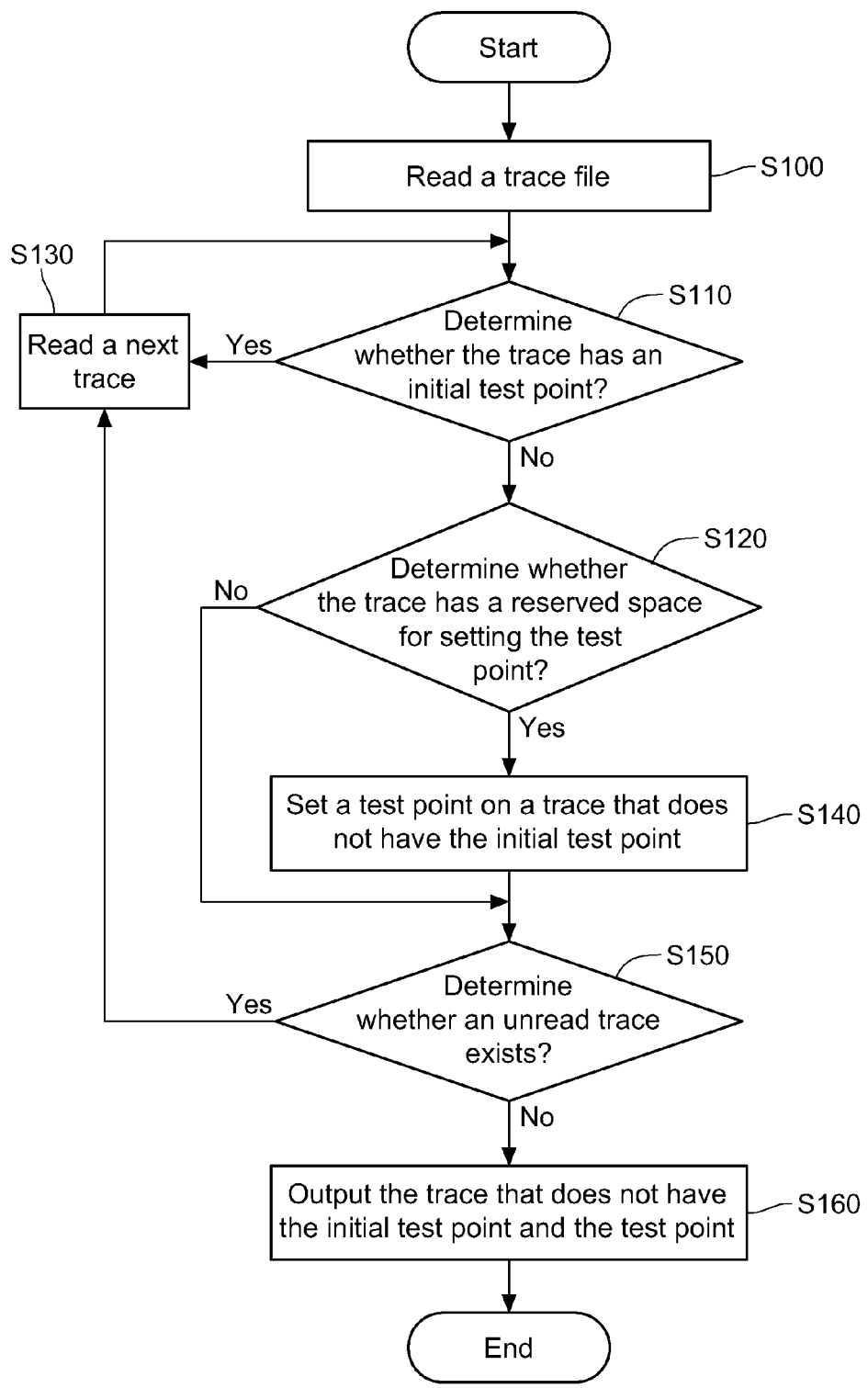
FIG. 1 is a flow chart of steps of a method for setting a test point according to a first embodiment of the present invention.

FIG. 1 is a flow chart of steps of a method for setting a test point according to a first embodiment of the present invention. The method for setting the test point may be used to, but is not limited to, dispose a test point on a circuit board in a trace file. In other embodiments of the present invention, the method may also be applied to other electronic components with a trace design. The present invention is described in detail with the method for setting the test point on the circuit board in the trace file as a preferred embodiment.

According to the first embodiment of the present invention, referring to FIG. 1, the steps may be performed by an automatic jig (such as an automatic program). Firstly, in Step S100, the program reads the trace file, in which the trace file may be an information file, for example, a NET_NAME file, when the circuit board is laid out, and the trace file may comprises one or more traces.

The trace file is used to define the setting of parameters on the circuit board, which comprise: whether the trace has an initial test point, position coordinates of the initial test point on the circuit board, a name of an element connected to the initial test point, and a test point type of the initial test point. Therefore, in Step S110, according to the method of the first embodiment of the present invention, whether each trace has an initial test point is determined one by one according to the read trace file, and if yes, the trace which has the initial test point is skipped, and a next trace in the trace file is read (corresponding to step S130); otherwise, Step S120 is then performed, in which whether the trace has a reserved space for setting the test point is determined. In particular, when the test point is arranged, since the test point occupies a certain area, a test space is necessarily to be reserved around the test point. Generally, a space of at least 30 mil is necessarily to be reserved around the test point, so as to exclude the appearance of other electric elements, pads, or test points.

Therefore, when the trace has the reserved space for setting the test point, according to the method of the first embodiment of the present invention, Step S140 is then performed, in which a test point is set on the trace. The arrangement position of the test point may be randomly set without limitation, so as to improve the efficiency of the program in automatically arranging the test point. Then, in Step S150, whether an unread trace exists in the trace file is determined, and if yes, the program returns to Step S130, in which the unread trace is read; otherwise, Step S160 is performed, in which the trace that does not have the initial test point and the test point is output, to allow a user to manually set the test point position(s) of the trace(s) that does (or do) not have the initial test point and the test point. For example, the user may detect whether the trace has the test point through a tool in a test system (such as TOOL in MENTOR system).

Figure 2A:
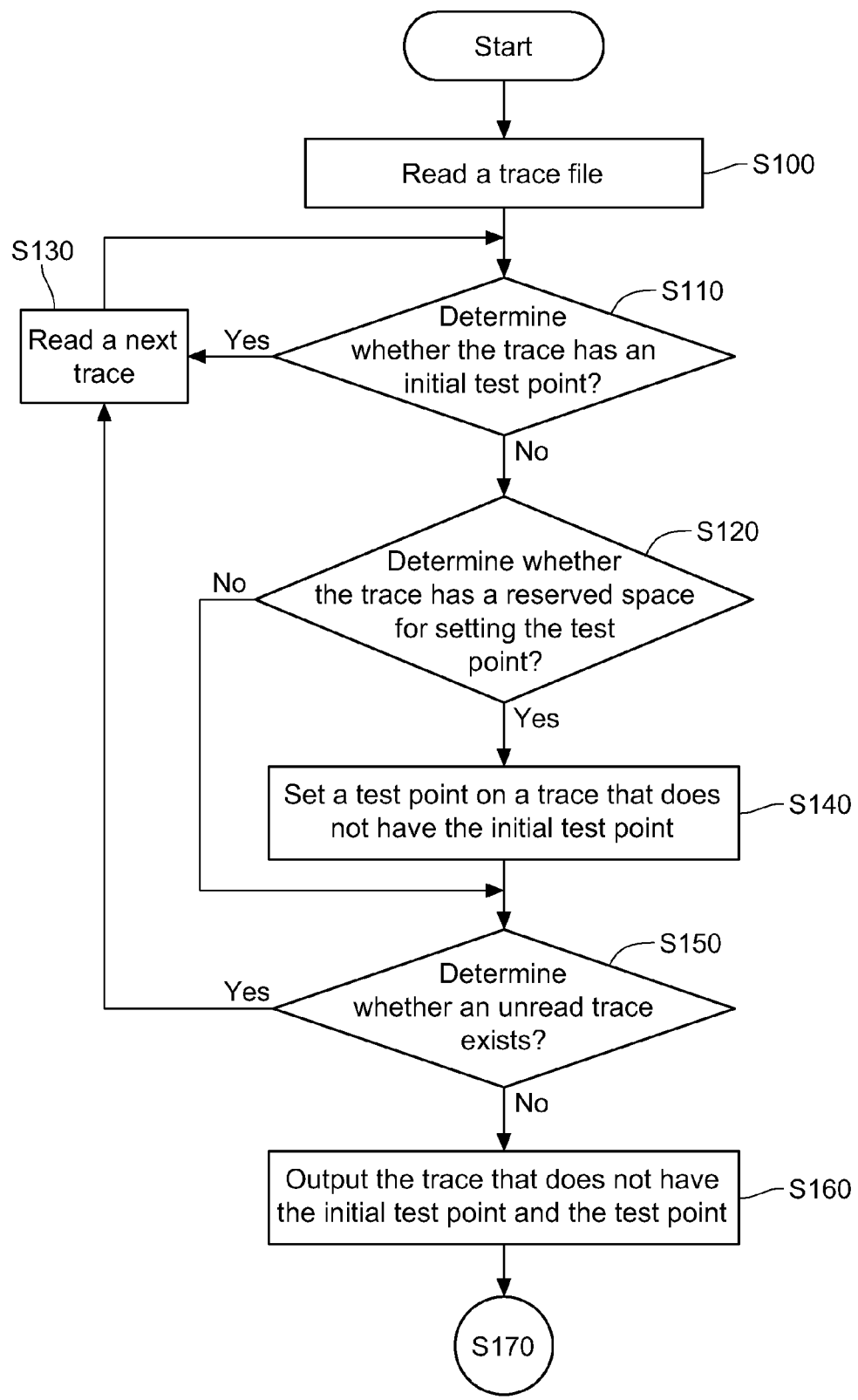
FIGS. 2A and 2B are flow charts of steps of a method for setting a test point according to a second embodiment of the present invention.
Figure 2B:
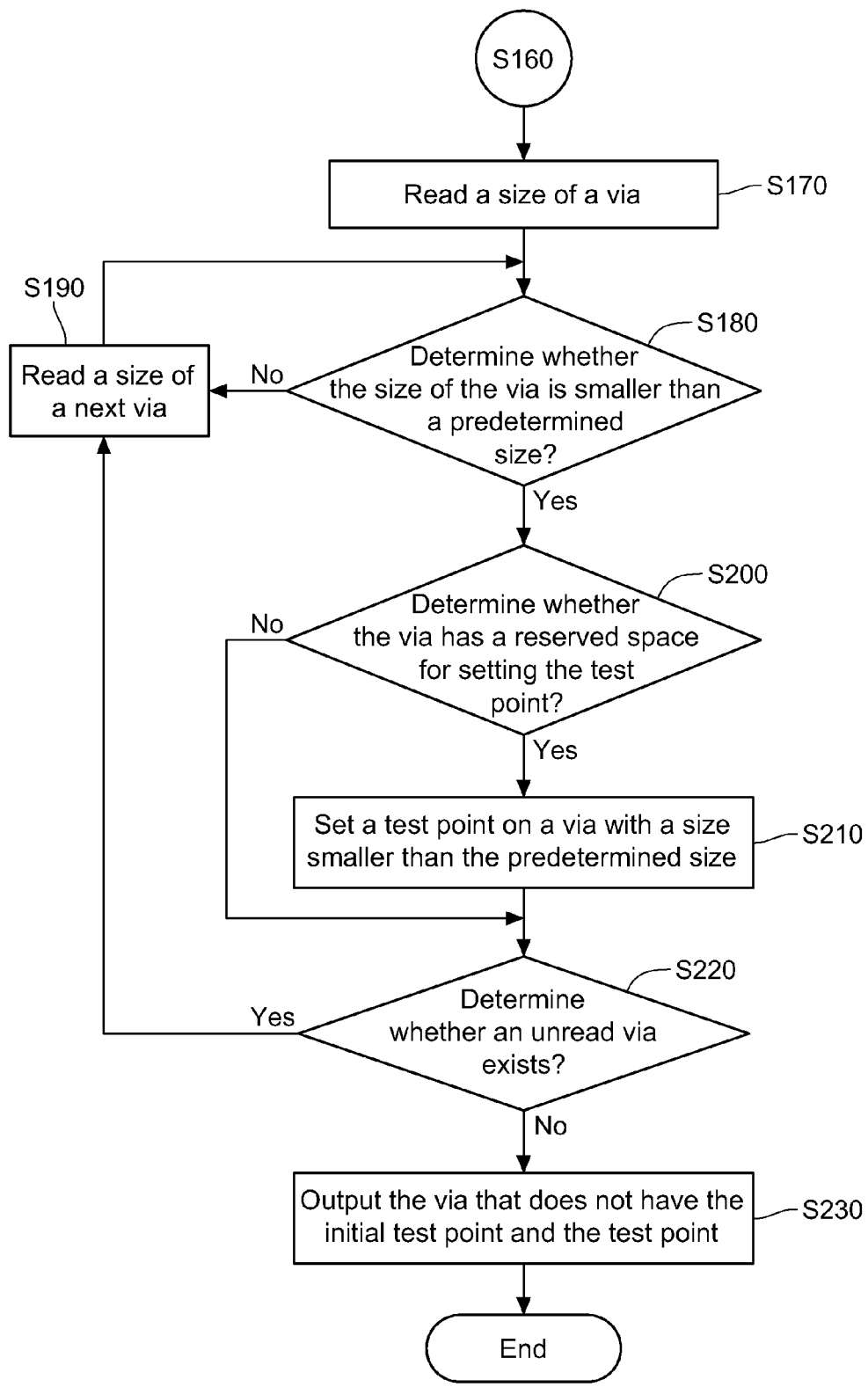

FIGS. 2A and 2B are flow charts of steps of a method for setting a test point according to a second embodiment of the present invention, which comprise Steps S100, S110, S120, S130, S140, S150, and S160, and steps S170 to S230. Step S100 to S160 are the same as those of the first embodiment of the present invention, and will not be described again herein. Referring to FIG. 2B, according to the method of the second embodiment of the present invention, Step S170 is performed after Step S160, in which a size of a via on a circuit board is read. The size of the via may be the information defined in the trace file, or another independent data file, both of which may be used to realize the effect of the present invention, instead of being used to limit the scope of the present invention.

In Step S180, according to the method of the second embodiment of the present invention, whether the size of the via is smaller than a predetermined size is determined one by one. Generally, the predetermined size of the via may be set to be an inner diameter/outer diameter ratio of, such as, 20/10 and 18/10. Therefore, when the size of the via is larger than the predetermined size, the program skips the via with a size larger than the predetermined size, and Step S190 is performed, in which a size of a next via is read; otherwise, the program performs Step S200, in which and whether the via with a size smaller than the predetermined size has a reserved space for setting a test point is determined. Similarly, a test space is necessarily to be reserved around the test point when the test point is arranged, so as to exclude the appearance of other electric elements, pads, or test points.

Therefore, when the via has the reserved space for setting the test point, according to the method of the second embodiment of the present invention, Step S210 is then performed, in which a test point is set on the via with a size smaller than the predetermined size. The arrangement position of the test point may be set randomly without limitation, so as to improve the efficiency of the program in automatically arranging the test point. Then, in Step S220, whether unread via information exists is determined, and if yes, the program returns to Step S190, in which the unread via information is read; otherwise, step S230 is performed, in which the via that does not have the initial test point and test point is output, to allow a user to manually set the test point position(s) of the via(s) that does (or do) not have the initial test point and the test point.

It should be noted that, the method for setting the test point according to the present invention is not limited to the above two embodiments. In other embodiments of the present invention, in the method for setting the test point, the test point position may be selectively set merely according to the trace in the trace file or merely according to the size of the via, depending on the layout design of an actual circuit board. When the method for setting the test point is performed simultaneously according to both the trace in the trace file and the size of the via, a performing order is not intended to limit the scope of the present invention.

Therefore, in the method for setting the test point of the present invention, not only one or more test points may be rapidly arranged through an automatic jig, but also the trace or via that does not have the initial test point and the test point may be output, to allow the user to manually set the test point, thereby having the efficiency of the automatic arrangement and the flexibility of the manual arrangement.

According to the method for setting the test point of the present invention, cost and time for manually disposing the test point are saved, and an error rate when the test point is arranged is further reduced, thereby effectively improving production efficiency of a printed circuit board.

What is claimed is:

1. A method for setting a test point by using a computer, applied to dispose at least one test point on a circuit board in a trace file, the method comprising:

reading the trace file, by using said computer, wherein the trace file comprises at least one trace;

determining whether the trace has an initial test point;

reading a next trace in the trace file when the trace has the initial test point;

determining whether the trace has a test space reserved around the trace for placement of the test point;

if the trace has the test space for placement of the test point, setting the test point on the trace that does not have the initial test point, and if the trace does not have the test space for placement of the test point, determining if there is any unread trace;

if there is unread trace, reading the next trace in the trace file, and if there is no unread trace, outputting the trace that does not have the initial test point and the test point; and setting the test point on the trace that does not have the initial test point.

2. The method for setting the test point according to claim 1, further comprising:

reading a next trace in the trace file when the trace has the initial test point.

3. The method for setting the test point according to claim 1, wherein a test space is reserved around the trace.

4. The method for setting the test point according to claim 1, wherein the trace file comprises position coordinates of the initial test point on the circuit board, a name of an element connected to the initial test point, and a test point type of the initial test point.

5. The method for setting the test point according to claim 1, further comprising:

outputting the trace that does not have the initial test point and the test point, to allow a user to manually set a test point position of the trace that does not have the initial test point and the test point.

6. The method for setting the test point according to claim 1, further comprising:

reading a size of a via;

determining whether the size of the via is smaller than a predetermined size; and setting the test point on the via with a size smaller than the predetermined size.

7. The method for setting the test point according to claim 6, further comprising:

reading a size of a next via when the size of the via is larger than the predetermined size.

8. The method for setting the test point according to claim 6, wherein a test space is reserved around the test point.

9. The method for setting the test point according to claim 6, wherein the trace file comprises position coordinates of the initial test point on the circuit board, a name of an element connected to the initial test point, and a test point type of the initial test point.

10. The method for setting the test point according to claim 7, further comprising:

outputting the via that does not have the initial test point and the test point, to allow a user to manually set a test point position of the via that does not have the initial test point and the test point.

11. The method for setting the test point according to claim 1, further comprising:

reading a size of a via;

determining whether the size of the via is smaller than a predetermined size;

if the size of the via is larger than the predetermined size, reading a size of a next via, and if the size of the via is not larger than the predetermined size, determining whether the via has a test space reserved around the via for the test point;

if the via has the test space reserved for the test point, setting the test point on the via with the size smaller than the predetermined size, and if the via does not have the test space reserved for the test point, further determining if there is any unread via; and if there is unread via, reading the next via, and if there is no unread via, outputting the via that does not have the initial test point and the test point.

* * * * *